United States Patent
Nebashi et al.

(10) Patent No.: US 10,037,789 B2
(45) Date of Patent: Jul. 31, 2018

(54) MAGNETIC MEMORY AND METHOD FOR WRITING DATA INTO MAGNETIC MEMORY ELEMENT

(71) Applicants: NEC Corporation, Minato-ku, Tokyo (JP); TOHOKU UNIVERSITY, Sendai-shi, Miyagi (JP)

(72) Inventors: Ryusuke Nebashi, Tokyo (JP); Noboru Sakimura, Tokyo (JP); Yukihide Tsuji, Tokyo (JP); Ayuka Tada, Tokyo (JP); Hideo Ohno, Miyagi (JP)

(73) Assignees: NEC CORPORATION, Tokyo (JP); TOHOKU UNIVERSITY, Miyagi (JP)

( * ) Notice: Subject to any disclaimer, the term of this patent is extended or adjusted under 35 U.S.C. 154(b) by 0 days.

(21) Appl. No.: 15/519,851

(22) PCT Filed: Aug. 31, 2015

(86) PCT No.: PCT/JP2015/004399
§ 371 (c)(1),
(2) Date: Apr. 18, 2017

(87) PCT Pub. No.: WO2016/063448
PCT Pub. Date: Apr. 28, 2016

(65) Prior Publication Data
US 2017/0249981 A1    Aug. 31, 2017

(30) Foreign Application Priority Data
Oct. 21, 2014    (JP) .................................. 2014-214729

(51) Int. Cl.
G11C 11/14    (2006.01)
G11C 11/16    (2006.01)
(Continued)

(52) U.S. Cl.
CPC .............. G11C 11/16 (2013.01); G11C 11/15 (2013.01); H01L 27/105 (2013.01);
(Continued)

(58) Field of Classification Search
CPC ....... G11C 11/16; G11C 11/15; H01L 27/222; H01L 29/82; H01L 27/105; H01L 43/08
(Continued)

(56) References Cited

U.S. PATENT DOCUMENTS

2003/0161181 A1    8/2003    Saito et al.
2009/0021866 A1    1/2009    Togawa et al.

FOREIGN PATENT DOCUMENTS

JP    2003-209226 A    7/2003
JP    2006-310423 A    11/2006
(Continued)

OTHER PUBLICATIONS

"Magnetic Memory Cell and Magnetic Random Access Memory", Aug. 7, 2014, JP2014143302.*
(Continued)

*Primary Examiner* — Tha-O H Bui

(57) ABSTRACT

In order to stably write data into a magnetic memory that uses in-plane current-induced perpendicular switching of magnetization to write data, the magnetic memory includes a recording layer formed as a perpendicular magnetization film, an adjacent layer joined to an upper surface or a lower surface of the recording layer, an external magnetic field application part configured to apply a first external magnetic field to the recording layer in a first direction which is an in-plane direction of the recording layer, and a current application part configured to allow a write current to flow through the adjacent layer in the first direction or a second direction which is opposite to the first direction. The external magnetic field application part is configured to switch a
(Continued)

direction of a second external magnetic field applied in a direction perpendicular to the first direction in accordance with a direction of the write current.

13 Claims, 11 Drawing Sheets

(51) Int. Cl.
    *H01L 27/105*     (2006.01)
    *H01L 29/82*     (2006.01)
    *H01L 43/08*     (2006.01)
    *G11C 11/15*     (2006.01)
    *H01L 27/22*     (2006.01)

(52) U.S. Cl.
    CPC ............ *H01L 27/222* (2013.01); *H01L 29/82* (2013.01); *H01L 43/08* (2013.01)

(58) Field of Classification Search
    USPC ........................................................ 365/171
    See application file for complete search history.

(56) References Cited

FOREIGN PATENT DOCUMENTS

| | | |
|---|---|---|
| JP | 2009-026354 A | 2/2009 |
| JP | 2010-003850 A | 1/2010 |
| JP | 2014-143302 A | 8/2014 |
| WO | 2014/011533 A1 | 1/2014 |

OTHER PUBLICATIONS

I. M. Miron et al., "Perpendicular switching of a single ferromagnetic layer induced by in-plane current injection", Nature, Aug. 11, 2011, vol. 476, p. 189.

L. Liu et al., "Spin-Torque Switching with the Giant Spin Hall Effect of Tantalum", Science, May 4, 2012, vol. 336, p. 555-558.

L. Liu et al., "Current-Induced Switching of Perpendicularly Magnetized Magnetic Layers Using Spin Torque from the Spin Hall Effect", Physical Review Letters (PRL) 109, 096602-1-096602-5, Aug. 31, 2012.

Ki-Seung Lee et al., "Threshold current for switching of a perpendicular magnetic layer induced by spin Hall effect", Applied Physics Letters 102, 112410-1-112410-5, Mar. 30, 2013.

T. D. Skinner et al., "Spin-orbit torque opposing the Oersted torque in ultrathin Co/Pt bilayers", Applied Physics Letters, 104, 062401-1-062401-4, Feb. 10, 2014.

International Search Report for PCT Application No. PCT/JP2015/004399, dated Oct. 6, 2015.

English translation of Written opinion for PCT Application No. PCT/JP2015/004399.

\* cited by examiner

MAGNETIC MEMORY AND METHOD FOR WRITING DATA INTO MAGNETIC MEMORY ELEMENT

This application is a National Stage Entry of PCT/JP2015/004399 filed on Aug. 31, 2015, which claims priority from Japanese Patent Application 2014-214729 filed on Oct. 21, 2014, the contents of all of which are incorporated herein by reference, in their entirety.

TECHNICAL FIELD

This invention relates to a magnetic memory and a method of writing data into a magnetic memory element, and more particularly, to a magnetic memory including a magnetic memory element that uses a perpendicular magnetization film (magnetic film having perpendicular magnetic anisotropy) as a recording layer configured to hold data, and a method of writing data into the magnetic memory element having such configuration.

BACKGROUND ART

A magnetic random access memory and other such magnetic memories are memories each configured to record data as a direction of magnetization of a magnetic film. The magnetic film configured to record data as the direction of magnetization is hereinafter sometimes called "recording layer". The magnetic memory has desired features as a memory, such as low-voltage and high-speed operation, non-volatility, and high rewrite endurance, and hence is being developed vigorously.

In early magnetic memories, data has been written by allowing an electric current to flow through wiring provided in the vicinity of the recording layer to generate a current-induced magnetic field (Oersted field), and switching the magnetization to a desired direction with the current-induced magnetic field (for example, see Patent Documents 1 and 2). However, the method of switching the magnetization with the current-induced magnetic field has a problem in that a write current is increased when a memory cell size is reduced.

In recent years, as a method of more efficient writing into the magnetic memory, there have been proposed methods of writing using spin carried by electrons. One of those methods of writing is a method of switching magnetization by allowing a spin-polarized current to flow in an in-plane direction of the recording layer to move a magnetic domain wall. In a magnetic memory using a perpendicular magnetization film as the recording layer, the method involving moving the magnetic domain wall with the spin-polarized current is considered to be especially useful. In recent years, various devices utilizing electron spin have been proposed, and such technology is sometimes called spintronics.

One of achievements in recent years in spintronics is that there has been found, as a method of achieving switching of magnetization of the perpendicular magnetic film, a phenomenon in which the magnetization of the perpendicular magnetic film is switched by applying a magnetic field to the perpendicular magnetic film in the in-plane direction, and allowing an electric current to flow through a heavy metal film (for example, Pt film or Ta film), which is joined to the perpendicular magnetic film, in a direction that is parallel to the magnetic field (for example, see Non Patent Documents 1 and 2). It is considered that this phenomenon in which the magnetization is switched is caused by an effect of a Rashba field, spin injection by the spin Hall effect, or both. This switching of magnetization is hereinafter sometimes called "in-plane current-induced perpendicular switching of magnetization".

FIG. 1 is a conceptual diagram for illustrating the in-plane current-induced perpendicular switching of magnetization. Here, according to Non Patent Document 3, the phenomenon of the in-plane current-induced perpendicular switching of magnetization will be described as being caused by the spin injection by the spin Hall effect. In FIG. 1, the structure in which an adjacent layer 101 is joined to a perpendicular magnetic film 102 is illustrated. The perpendicular magnetic film 102 has perpendicular magnetization (magnetization in thickness direction), and the perpendicular magnetization is denoted by a reference symbol 102a. As the adjacent layer 101, a heavy metal film, for example, a Pt film or a Ta film, which strongly exhibits the spin Hall effect, is used. In FIG. 1, there is defined an xyz orthogonal coordinate system in which an x-axis and a y-axis are defined in an in-plane direction of the adjacent layer 101 and the perpendicular magnetic film 102, and in which a z-axis is defined in a thickness direction of the adjacent layer 101 and the perpendicular magnetic film 102, and in the following description, this xyz orthogonal coordinate system is sometimes used to indicate directions.

In the structure of FIG. 1, when an electric current Iy is allowed to flow through the adjacent layer 101 in parallel to the y-axis direction while applying a magnetic field Hy to the perpendicular magnetic film 102 in parallel to the y-axis direction, switching of magnetization occurs. A direction in which the magnetization of the perpendicular magnetic film 102 is switched depends on directions of the magnetic field Hy, the electric current Iy, and a spin current generated by the spin Hall effect. The direction of the spin current depends on the direction of the electric current Iy and a sign of a spin Hall angle of the adjacent layer 101. For example, in a case where the magnetization of the perpendicular magnetic film 102 is initially directed to a +z direction, and a Pt film is used as the adjacent layer 101, when the electric current Iy (>0) is allowed to flow through the adjacent layer 101 in a +y direction while applying the magnetic field Hy (>0) to the perpendicular magnetic film 102 in the +y direction, the magnetization of the perpendicular magnetic film 102 is switched from the +z direction to a −z direction. Such switching of magnetization cannot be explained as the switching of magnetization by the current-induced magnetic field, which is caused by allowing the electric current to flow through the adjacent layer 101, or the switching of magnetization by the injection of the spin-polarized current.

According to Non Patent Document 3, the above-mentioned in-plane current-induced perpendicular switching of magnetization is theoretically described as follows. A behavior of magnetization of a magnetic film is expected to follow the following Landau-Lifshitz-Gilbert equation (LLG equation):

$$\frac{dm}{dt} = \gamma \tau_{tot} + \alpha \left( m \times \frac{dm}{dt} \right) \tag{1}$$

In the equation, m represents a unit magnetization vector, and components of the unit magnetization vector m in the xyz orthogonal coordinate system are $m=(m_x, m_y, m_z)$. Moreover, $\gamma$ represents a gyromagnetic ratio, $\alpha$ represents a damping constant, and $\tau_{tot}$ represents total torque that acts on the magnetization.

The total torque $\tau_{tot}$ is obtained by the following equation (2):

$$\tau_{tot} = \tau_{st} + \tau_{ext} + \tau_{an} \quad (2)$$

In other words, the total torque $\tau_{tot}$ is expressed as a sum of Slonczewski-like torque $\tau_{st}$ including a contribution from the spin Hall effect induced by the electric current, torque $\tau_{ext}$ induced by an external magnetic field, and torque $\tau_{an}$ caused by magnetic anisotropy.

Here, terms of the above-mentioned equation (2) are expressed as the following equations (3), (4), and (5), respectively:

$$\tau_{st} = \tau_{st}^0 (m \times x \times m) \quad (3)$$

$$\tau_{ext} = -m \times B_{ext} \quad (4)$$

$$\tau_{an} = -B_{an}^0 m_z (m \times z) \quad (5)$$

In the equations, $\tau_{st}^0$ represents the Slonczewski-like torque, and is proportional to the write current. $B_{ext}$ represents a vector of the external magnetic field, and components of the vector in the xyz orthogonal coordinate system are $B_{ext} = (B_x, B_y, B_z)$. Moreover, x represents a unit vector in an x direction, y represents a unit vector in a y direction, and z represents a unit vector in a z direction. $B_{an}^0$ represents an anisotropic magnetic field. In Non Patent Document 3, it is reported that the equation (1) well explains the in-plane current-induced perpendicular switching of magnetization. As the Slonczewski-like torque, in addition to the contribution by the spin Hall effect, according to Non Patent Document 1, a contribution from a Rashba field, which is generated by an electric current flowing through a recording layer, is suggested.

The inventors of this invention consider the use of the above-mentioned in-plane current-induced perpendicular switching of magnetization for writing data into a recording layer of a memory cell of a magnetic memory (that is, switching of magnetization). Using the in-plane current-induced perpendicular switching of magnetization to write data may improve data writing properties.

One of problems in writing data using the in-plane current-induced perpendicular switching of magnetization is that an intermediate state (state in which whether "0" or "1" is indicated is indefinite) may exist in the recording layer. For example, in Non Patent Document 3, it is disclosed that an intermediate state may exist when the magnetization is switched using the in-plane current-induced perpendicular switching of magnetization. The existence of the intermediate state is undesirable in writing data.

Non Patent Document 4 relates to a writing method using the in-plane current-induced perpendicular switching of magnetization, and it is demonstrated by simulation that miswriting can be reduced by increasing a damping constant.

Moreover, in Patent Document 3, there is disclosed a technology of controlling a magnetization state of a ferromagnetic material by applying a current pulse while externally applying a weak magnetic field to the ferromagnetic material.

PRIOR ART DOCUMENT(S)

Patent Document(s)

Patent Document 1: JP 2003-209226 A
Patent Document 2: JP 2006-310423 A
Patent Document 3: JP 2009-26354 A Non-Patent Document(s)

Non Patent Document 1: I. M. Miron, et al., "Perpendicular switching of a single ferromagnetic layer induced by in-plane current injection", Nature, 11 Aug. 2011, vol. 476, p. 189.
Non Patent Document 2: L. Liu, et al., "Spin-Torque Switching with the Giant Spin Hall Effect of Tantalum", Science, 4 May 2012, vol. 336, p. 555.
Non Patent Document 3: L. Liu, et al., "Current-Induced Switching of Perpendicularly Magnetized Magnetic Layers Using Spin Torque from the Spin Hall Effect", Phys. Rev. Lett., 109, 096602 (2012).
Non Patent Document 4: Ki-Seung Lee, et al., "Threshold current for switching of a perpendicular magnetic layer induced by spin Hall effect", Applied Physics Letters, 102, 112410 (2013)
Non Patent Document 5: T. D. Skinner, et al., "Spin-orbit torque opposing the Oersted torque in ultrathin Co/Pt bilayers", Applied Physics Letters, 104, 062401 (2014)

SUMMARY OF INVENTION

Problem to be Solved by the Invention

Therefore, it is an example object of this invention to provide a technology for facilitating stably writing data into a magnetic memory that uses in-plane current-induced perpendicular switching of magnetization to write data.

Solution to Problem

According to one example aspect of the present invention, a magnetic memory includes a recording layer formed as a perpendicular magnetic film, an adjacent layer joined to an upper surface or a lower surface of the recording layer, an external magnetic field application part configured to apply a first external magnetic field to the recording layer in a first direction which is an in-plane direction of the recording layer, and a current application part configured to allow a write current to flow through the adjacent layer in the first direction or a second direction which is opposite to the first direction. The recording layer, the adjacent layer, and the external magnetic field application part are configured to switch any one of a first magnetic field application direction, a second magnetic field application direction, and a third magnetic field application direction in accordance with a direction of the write current. The first magnetic field application direction is a direction of a second external magnetic field applied in a direction perpendicular to the first direction. The second magnetic field application direction is a direction of a sum of an effective magnetic field caused by field-like torque generated when the write current flows through the adjacent layer and the recording layer and an Oersted field generated when the write current flows through the adjacent layer. The third magnetic field application direction is a direction of an actual magnetic field which is a sum of the second external magnetic field, the effective magnetic field, and the Oersted field.

According to another example aspect of the present invention, there is provide a method of writing data into a magnetic memory element including a recording layer formed as a perpendicular magnetic film and an adjacent layer joined to an upper surface or a lower surface of the recording layer. The method of writing data includes applying a first external magnetic field to the recording layer in a first direction which is an in-plane direction of the recording layer, allowing a write current to flow through the adjacent layer in the first direction or a second direction which is opposite to the first direction, and applying a second external magnetic field in a direction perpendicular to the first direction. The direction of the second external magnetic field or a direction of an actual magnetic field is switched in accordance with a direction of the write current. The actual magnetic field is a sum of an effective magnetic field caused by field-like torque generated when the write current flows through the adjacent layer and the recording layer, an Oersted field generated when the write current flows through the adjacent layer, and the second external magnetic field.

At this time, data may be written without applying the second external magnetic field. In this case, the adjacent layer and the recording layer are formed so that a direction of a sum of an effective magnetic field caused by field-like torque generated when the write current flows through the adjacent layer and the recording layer and the Oersted field generated when the write current flows through the adjacent layer, is switched in accordance with the direction of the write current.

Advantageous Effects of Invention

According to this invention, there can be provided a technology for facilitating stably writing data into the magnetic memory that uses the in-plane current-induced perpendicular switching of magnetization to write data.

DESCRIPTION OF EMBODIMENTS

Now, example embodiments of this invention will be described with reference to the accompanying drawings. It should be noted that, in the following description, like or corresponding components are referenced by like or similar reference symbols.

(First Example Embodiment)

Figure 1:
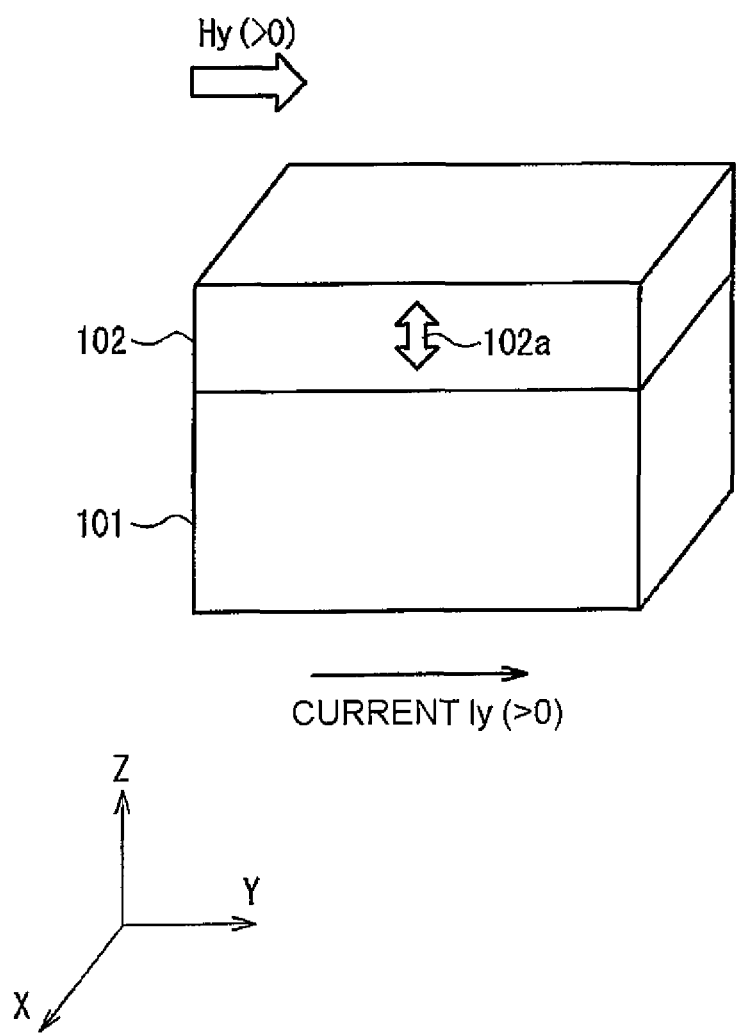
FIG. 1 is a conceptual diagram for illustrating in-plane current-induced perpendicular switching of magnetization.
Figure 2A:
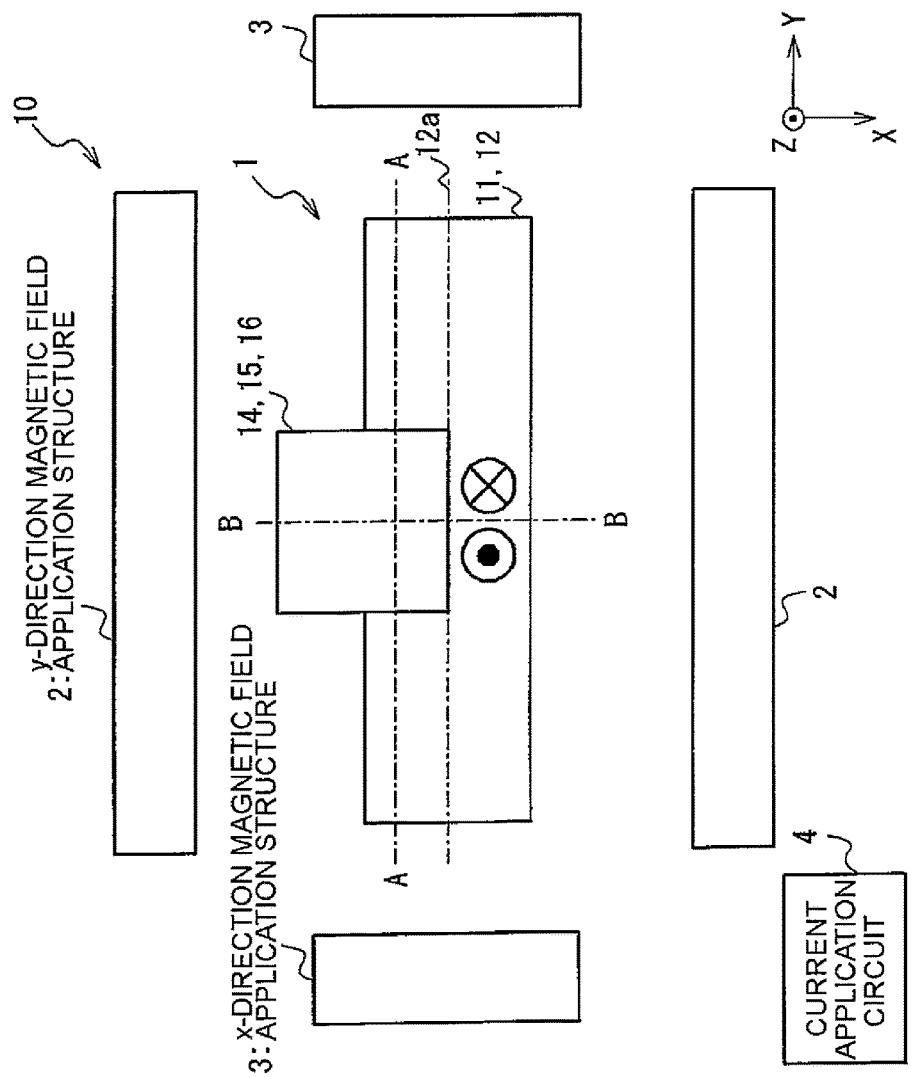
FIG. 2A is a plan view for illustrating the structure of a magnetic memory according to a first example embodiment of this invention.

FIG. 2A is a plan view for illustrating the structure of a magnetic memory 10 according to a first example embodiment of this invention. In the following description of the magnetic memory 10, xyz orthogonal coordinates are sometimes used to indicate directions.

Figure 2B:
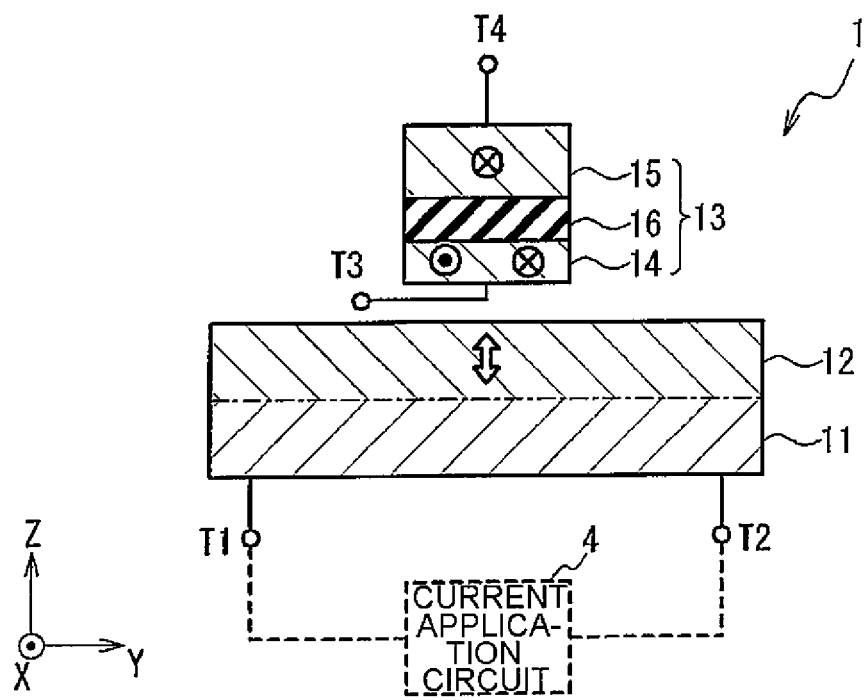
FIG. 2B is a cross-sectional view for illustrating a cross-sectional structure of a magnetic memory element according to the first example embodiment, which is taken along the cross section A-A of FIG. 2A.
Figure 2C:
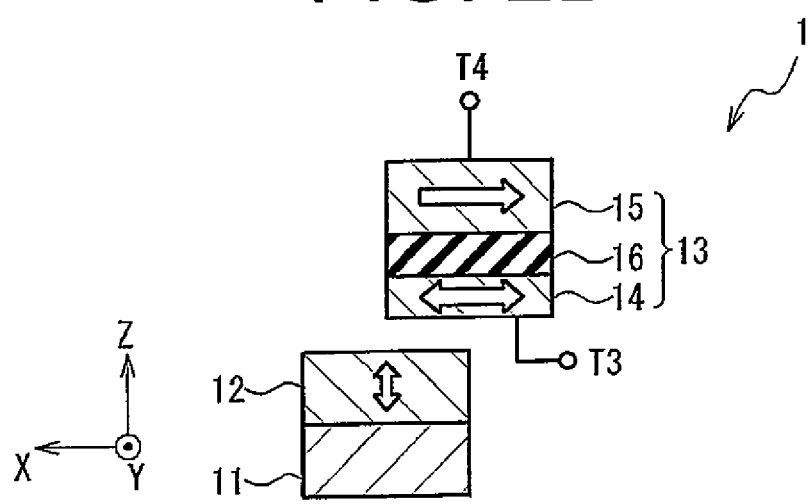
FIG. 2C is a cross-sectional view for illustrating a cross-sectional structure of the magnetic memory element according to the first example embodiment, which is taken along the cross section B-B of FIG. 2A.

The magnetic memory 10 includes a magnetic memory element 1, a y-direction magnetic field application structure 2, an x-direction magnetic field application structure 3, and a current application circuit 4. FIG. 2B and FIG. 2C are cross-sectional views for illustrating the structure of the magnetic memory element 1. Here, FIG. 2B illustrates a cross-sectional structure of the magnetic memory, which is taken along the cross section A-A illustrated in FIG. 2A, and FIG. 2C illustrates a cross-sectional structure of the magnetic memory, which is taken along the cross section B-B illustrated in FIG. 2A.

The magnetic memory element 1 includes an adjacent layer 11, a recording layer 12, and a magnetic tunnel junction (MTJ) 13. In FIG. 2A to FIG. 2C, an x-axis and a y-axis are defined to be orthogonal to each other in an in-plane direction of the adjacent layer 11 and the recording layer 12. Meanwhile, a z-axis is defined in a thickness direction of the adjacent layer 11 and the recording layer 12, that is, a direction orthogonal to both of the x-axis and the y-axis.

The adjacent layer 11 is formed of a metal film that strongly exhibits the spin Hall effect. For example, when the intrinsic spin Hall effect is expected, it is preferred that the adjacent layer 11 be formed of a metal film formed of Pt, Pd, Au, Ag, Cu, Ta, W, Nb, Mb, or an alloy containing two or more thereof. From the viewpoint of strongly exhibiting the spin Hall effect, it is desirable to use, among metal films made of those materials, a Pt film as the adjacent layer 11. Moreover, when the extrinsic spin Hall effect is expected, it is preferred that the adjacent layer 11 be formed of a metal film doped with at least one element selected from the group consisting of Mn, Ir, Bi, B, C, and N (for example, Cu film doped with at least one element selected from the group consisting of Mn, Ir, Bi, B, C, and N).

Near both ends of the adjacent layer 11, first and second terminals T1 and T2 are connected. Each of the first and second terminals T1 and T2 is connected to the current application circuit 4 via a selection transistor and a selector (not shown), and is used to allow a write current Iw to flow through the adjacent layer 11 and the recording layer 12 in the y-axis direction (+y direction or −y direction).

The recording layer 12 is formed of a perpendicular magnetic film having perpendicular magnetic anisotropy. In other words, magnetization of the recording layer 12 is switchable between a +z direction and a −z direction. As the recording layer 12, it is desired to use a film made of a ferromagnetic material or a ferrimagnetic material containing at least one of Fe, Co, and Ni. As examples of the film made of the ferromagnetic material that may be used as the recording layer 12, a Co/Ni laminated film (that is, laminated film formed by alternately laminating a plurality of Co films and a plurality of Ni films), a Co/Pd laminated film (that is, laminated film formed by alternately laminating a plurality of Co films and a plurality of Pd films), a Co/Pt laminated film (that is, laminated film formed by alternately laminating a plurality of Co films and a plurality of Pt films), a Co—Cr—Pt alloy film, and a Co—Fe—B alloy film are exemplified. As the film made of the ferrimagnetic material that may be used as the recording layer 12, Gd—Fe—Co alloy, Gd—Co alloy, and Tb—Fe—Co alloy films are exemplified.

On a surface of the recording layer 12 that is opposite to the adjacent layer 11, an insulating film, for example, a film made of a metal oxide, for example, Mg—O or Al—O (not shown) may be formed.

The MTJ 13 includes a sense layer 14, a reference layer 15, and a tunnel barrier layer 16.

The sense layer 14 is formed of a ferromagnetic material, and more specifically, an in-plane magnetic film having in-plane magnetic anisotropy. It is desired that the material of the sense layer 14 contain at least one selected from the group consisting of Fe, Co, and Ni, and the sense layer 14 is formed of a NiFe alloy film, a CoFeB alloy film, or a CoFe alloy film, for example. The sense layer 14 has a magnetization direction that is switchable between a +x direction and a −x direction.

The reference layer 15 is also formed of a ferromagnetic material, and more specifically, an in-plane magnetic film having in-plane magnetic anisotropy. The reference layer 15 is formed of a material similar to that of the sense layer 14. Magnetization of the reference layer 15 is fixed, and is not switched by write and read operations. In the first example embodiment, as illustrated in FIG. 2C, the reference layer 15 is fixed to the −x direction. In one example embodiment, in order to fix the magnetization of the reference layer 15, an antiferromagnetic layer (not shown) may be laminated on the reference layer 15. Alternatively, the reference layer 15 may be a laminated film formed by sequentially laminating a first ferromagnetic film, a non-magnetic film, and a second ferromagnetic film. In this case, magnetization of the first and second ferromagnetic films may be set to be directed antiparallel to each other by antiferromagnetic coupling.

The tunnel barrier layer 16 is an insulating non-magnetic layer. As a material of the tunnel barrier layer 16, Mg—O, Al—O, Ni—O, or Hf—O is exemplified. This tunnel barrier layer 16 is sandwiched between the sense layer 14 and the reference layer 15, and those sense layer 14, tunnel barrier layer 16, and reference layer 15 form the MTJ 13.

As illustrated in FIG. 2A and FIG. 2C, the sense layer 14 of the MTJ 13 is arranged with its center of gravity in an xy plane being shifted in the −x direction from a center line 12a of the recording layer 12, and is magnetically coupled to the recording layer 12. With such arrangement, the magnetization direction of the sense layer 14 is switched depending on a magnetization direction of the recording layer 12.

The sense layer 14 is connected to a third terminal T3, and the reference layer 15 is connected to a fourth terminal T4. As described later, in a read operation, a read current Ir is allowed to flow through the MTJ 13 by applying a voltage between the third and fourth terminals T3 and T4. A resistance value of the MTJ 13 depends on relative directions of magnetization of the sense layer 14 and the reference layer 15 by the magnetic tunnel effect. As described above, the magnetization direction of the sense layer 14 is switched depending on the magnetization direction of the recording layer 12, and hence the read current Ir may be allowed to flow through the MTJ 13 to obtain a current signal or voltage signal indicating the magnetization direction of the recording layer 12, that is, data written into the recording layer 12.

When the sense layer 14 is electrically connected to the adjacent layer 11 and the recording layer 12 (for example, when a conductive layer is provided between the sense layer 14 and the recording layer 12, and the sense layer 14 is joined to the recording layer 12 with interposition of the conductive layer), the third terminal T3 may not be provided, and the read current Ir may be allowed to flow between the first terminal T1 and the fourth terminal T4, or between the second terminal T2 and the fourth terminal T4.

Moreover, in FIG. 2A to FIG. 2C, the structure in which the sense layer 14 is closer to the recording layer 12 than the reference layer 15 is illustrated, but positions of the sense layer 14 and the reference layer 15 may be switched. In order to obtain desired magnetic properties of the sense layer 14 and the reference layer 15, it is sometimes better to provide the tunnel barrier layer 16 on an upper surface of the reference layer 15, and to provide the sense layer 14 on an upper surface of the tunnel barrier layer 16.

Figure 2D:
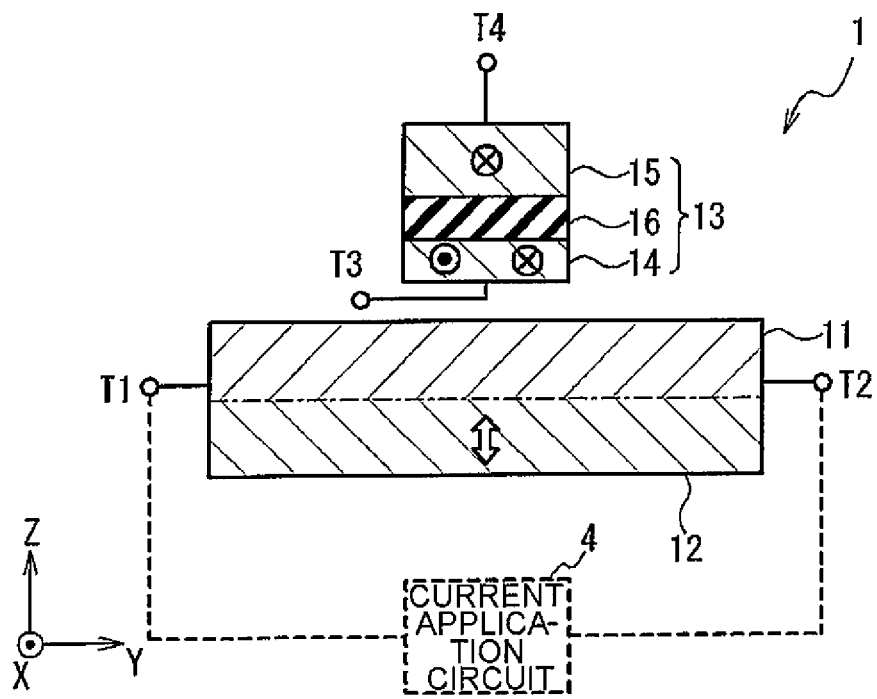
FIG. 2D is a cross-sectional view for illustrating a cross-sectional structure of a modified example of the magnetic memory element according to the first example embodiment, which is taken along the cross section A-A of FIG. 2A.
Figure 2E:
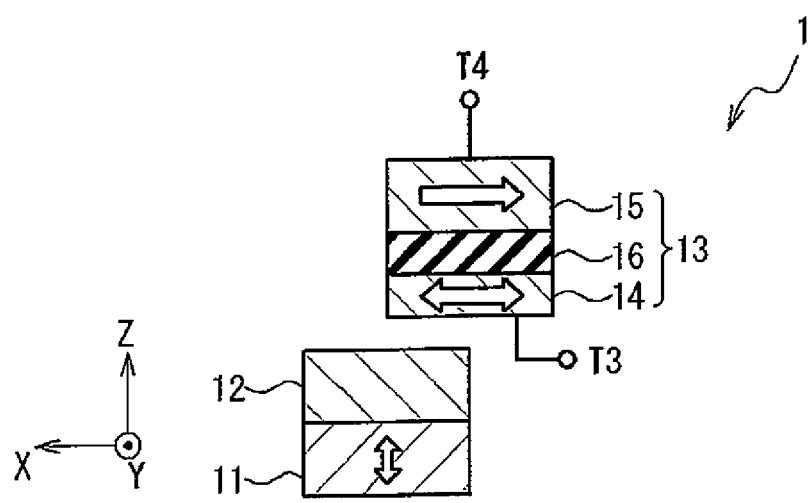
FIG. 2E is a cross-sectional view for illustrating a cross-sectional structure of the modified example of the magnetic memory element according to the first example embodiment, which is taken along the cross section B-B of FIG. 2A.

Moreover, in FIG. 2B and FIG. 2C, the structure in which the adjacent layer 11 is joined to a lower surface of the recording layer 12 (that is, the structure in which the recording layer 12 is joined to an upper surface of the adjacent layer 11) is illustrated, but as illustrated in FIG. 2D and FIG. 2E, positions of the adjacent layer 11 and the recording layer 12 may be switched. In the structure of FIG. 2D and FIG. 2E, the adjacent layer 11 is joined to the lower surface of the recording layer 12. In this case also, the recording layer 12 and the sense layer 14 are arranged to be magnetically coupled to each other.

Referring back to FIG. 2A, the y-direction magnetic field application structure 2 and the x-direction magnetic field application structure 3 form an external magnetic field application part which is configured to apply an external magnetic field to the recording layer 12 in the in-plane direction. Specifically, the y-direction magnetic field application structure 2 is configured to apply a first external magnetic field By to the recording layer 12 of the magnetic memory element 1 in a direction (+y direction or −y direction) that is parallel to the y-axis direction. In one example embodiment, wiring may be arranged as the y-direction magnetic field application structure 2 in the vicinity of the magnetic memory element 1, and an electric current may be allowed to flow through the wiring to apply an Oersted field (current-induced magnetic field) to the recording layer 12 in parallel to the y-axis direction. Alternatively, a ferromagnetic material may be arranged as the y-direction magnetic field application structure 2 to apply the first external magnetic field By in a direction (+y direction or −y direction) that is parallel to the y-axis direction by the ferromagnetic material. The +y direction is also called "first direction", and the −y direction is also called "second direction".

Meanwhile, the x-direction magnetic field application structure 3 is a structure for applying a second external magnetic field Bx to the recording layer 12 in a direction (+x direction or −x direction) that is parallel to the x-axis direction. In one example embodiment, wiring may be arranged as the x-direction magnetic field application structure 3 in the vicinity of the magnetic memory element 1, and an electric current may be allowed to flow through the wiring to apply an Oersted field to the recording layer 12 in parallel to the x-axis direction. As described later, in the first example embodiment, the direction of the second external magnetic field Bx, which is applied by the x-direction magnetic field application structure 3, is selected from the +x direction and the −x direction depending on a direction of the write current Iw. The direction of the second external magnetic field Bx is also called "first magnetic field application direction".

The current application circuit 4 is connected to each of the first and second terminals T1 and T2 of the adjacent layer 11 via the selection transistor and the selector (both not shown), and allows the write current Iw to flow through the adjacent layer 11 and the recording layer 12. The direction of the write current Iw flowing through the adjacent layer 11 and the recording layer 12 is associated with data to be written. In one example embodiment, when data "1" is to be written, the write current Iw is allowed to flow in the +y direction, and when data "0" is to be written, the write current Iw is allowed to flow in the −y direction.

(State of Magnetic Memory Element 1 and Reading Data)

Figure 3A:
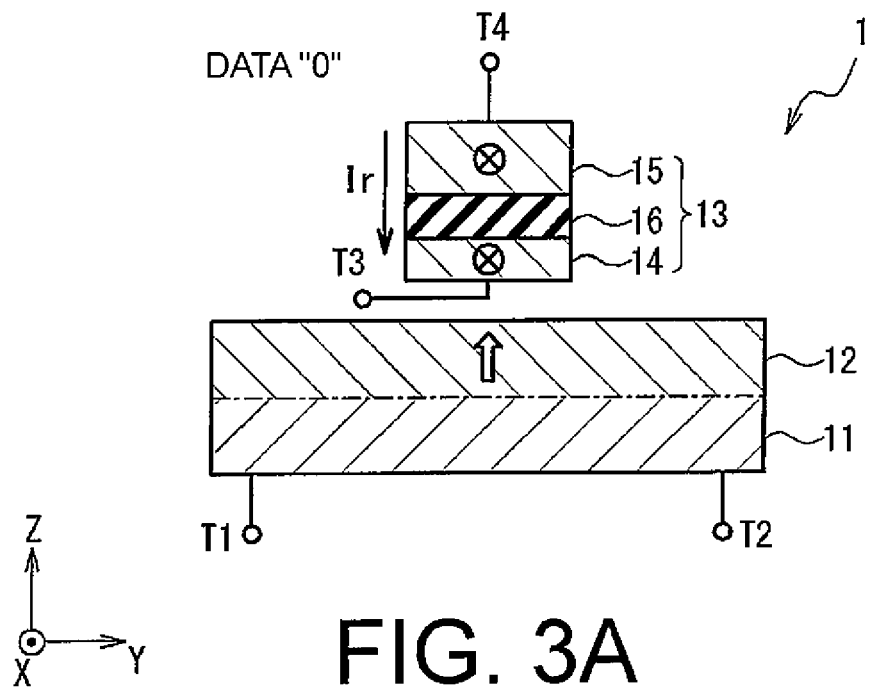
FIG. 3A is a cross-sectional view for conceptually illustrating a first state of the magnetic memory element according to the first example embodiment.
Figure 3B:
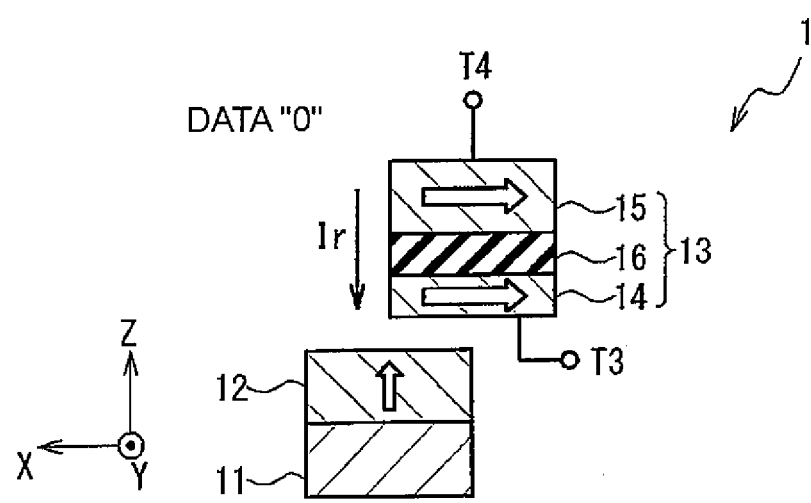
FIG. 3B is a cross-sectional view for conceptually illustrating the first state of the magnetic memory element according to the first example embodiment.
Figure 4A:
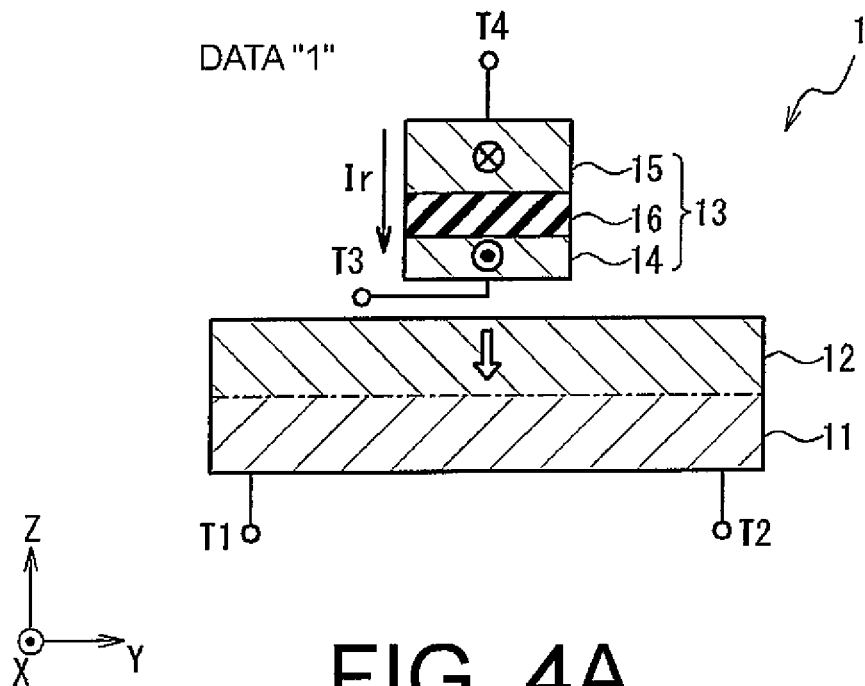
FIG. 4A is a cross-sectional view for conceptually illustrating a second state of the magnetic memory element according to the first example embodiment.
Figure 4B:
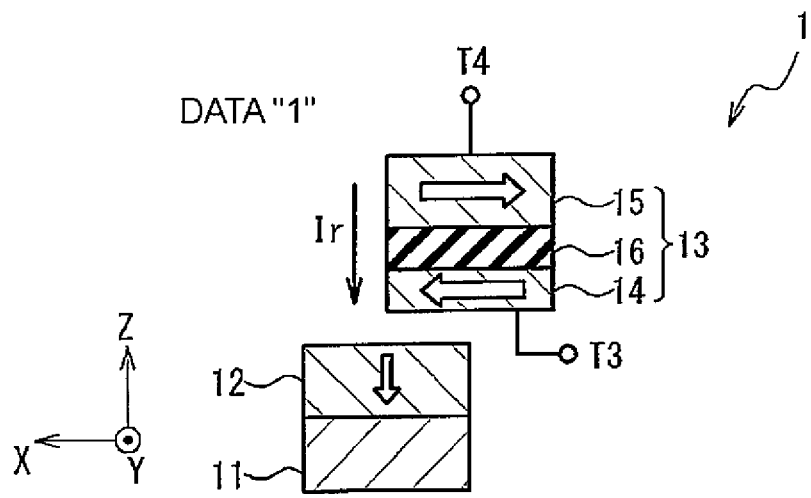
FIG. 4B is a cross-sectional view for conceptually illustrating the second state of the magnetic memory element according to the first example embodiment.

FIG. 3A and FIG. 3B illustrate one (first state) of two states that the magnetic memory element 1 may enter in the first example embodiment, and FIG. 4A and FIG. 4B illustrate another (second state) of the two states. One of the two states is associated with data "0", and another of the two states is associated with data "1".

More specifically, as illustrated in FIG. 3A and FIG. 3B, when the magnetization of the recording layer 12 is directed to the +z direction, a leakage magnetic field from the recording layer 12 has a component in the −x direction at the position of the sense layer 14, and the magnetization of the sense layer 14 is directed to the −x direction in accordance with the direction of the leakage magnetic field. In this case, the magnetization of the sense layer 14 and the reference layer 15 is parallel to each other, and the resistance value of the MTJ 13 is reduced (low resistance state). This low resistance state is associated with data "0", for example.

Meanwhile, as illustrated in FIG. 4A and FIG. 4B, when the magnetization of the recording layer 12 is directed to the −z direction, a leakage magnetic field from the recording layer 12 has a component in the +x direction at the position of the sense layer 14, and the magnetization of the sense layer 14 is directed to the +x direction in accordance with the direction of the leakage magnetic field. In this case, the magnetization of the sense layer 14 and the reference layer 15 is antiparallel to each other, and the resistance value of the MTJ 13 is increased (high resistance state). This high resistance state is associated with data "1", for example.

Data is read by allowing the read current Ir to flow between the third and fourth terminals T3 and T4. The read current Ir flows through the MTJ 13 so as to penetrate the tunnel barrier layer 16. As described above, the resistance value of the MTJ 13 indicates the relative directions of the magnetization of the sense layer 14 and the reference layer 15, that is, data stored in the recording layer 12, and hence the data stored in the recording layer 12 can be identified on the basis of the read current Ir or a read voltage generated from the read current Ir.

(Write Operation)

Figure 5A:
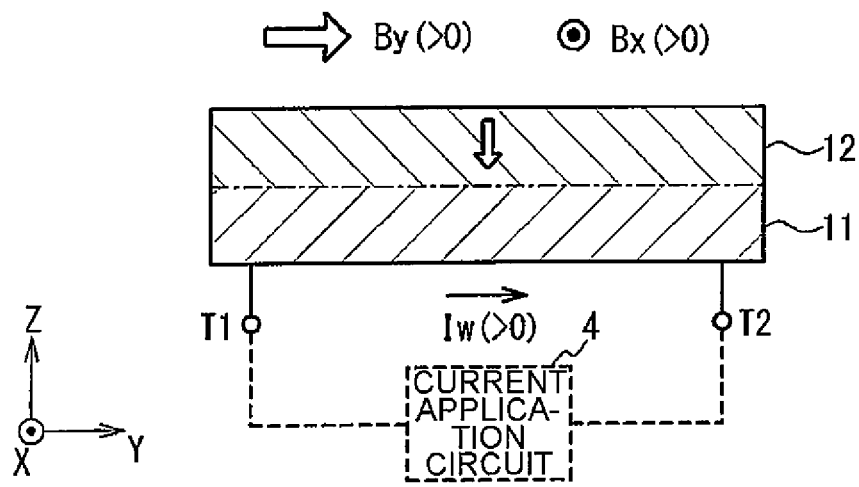
FIG. 5A is a cross-sectional view for conceptually illustrating an operation of writing data "1" into the magnetic memory according to the first example embodiment.
Figure 5B:
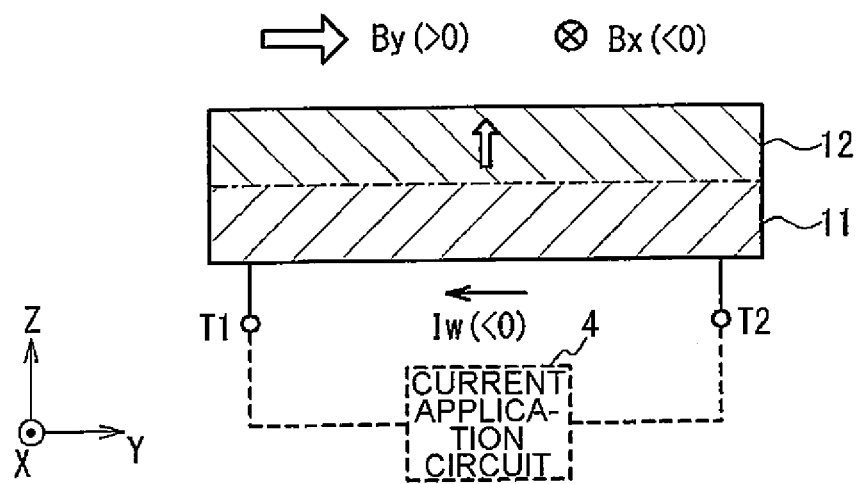
FIG. 5B is a cross-sectional view for conceptually illustrating an operation of writing data "0" into the magnetic memory according to the first example embodiment.

FIG. 5A and FIG. 5B are conceptual diagrams for illustrating an example of a write operation of a memory element according to the first example embodiment. The write operation is described below, and hence in FIG. 5A and FIG. 5B, the MTJ 13, which is not involved in the write operation, is not illustrated.

As an example, and as illustrated in FIG. 5A and FIG. 5B, a consideration is made of a case where the adjacent layer 11 is joined to the lower surface of the recording layer 12, a thin film (for example, Pt film) made of a material having a positive spin Hall angle is used as the adjacent layer 11, and the first external magnetic field By is applied to the recording layer 12 in the +y direction by the y-direction magnetic field application structure 2.

When data "1" is to be written into the magnetic memory element 1 that is in a state of storing data "0", as illustrated in FIG. 5A, the write current Iw is allowed to flow through the adjacent layer 11 and the recording layer 12 in the +y direction (that is, from the first terminal T1 to the second terminal T2) by the current application circuit 4. As a result, torque in the +x direction is generated as Slonczewski-like torque $\tau_{st}$. When a magnitude of the write current Iw exceeds a switching threshold current, the magnetization of the recording layer 12 is switched from the +z direction to the −z direction. In FIG. 5A, a magnetization state of data "1" after the writing is illustrated.

In contrast, when data "0" is to be written into the magnetic memory element 1 that is in a state of storing data "1", as illustrated in FIG. 5B, the write current Iw is allowed to flow through the adjacent layer 11 and the recording layer 12 in the −y direction (that is, from the second terminal T2 to the first terminal T1) by the current application circuit 4. As a result, torque in the −x direction is generated as Slonczewski-like torque $\tau_{st}$. When a magnitude of the write current Iw exceeds a switching threshold current, the magnetization of the recording layer 12 is switched from the −z direction to the +z direction. In FIG. 5B, a magnetization state of data "0" after the writing is illustrated.

One of findings of the inventors of this invention is that a write window can be enlarged by applying the second external magnetic field Bx in the x-axis direction. The term "write window" as used herein means such range of magnitudes and directions of the write current and the external magnetic field applied in the in-plane direction that the magnetic memory element 1 does not enter an intermediate state. The direction (first magnetic field application direction) of the second external magnetic field Bx is selected to be the same direction as that of the Slonczewski-like torque $\tau_{st}$, which acts on the magnetization of the recording layer 12.

More specifically, when data "1" is to be written into the magnetic memory element 1 (that is, when the magnetization of the recording layer 12 is to be switched to the −z direction), the write current Iw is allowed to flow through the adjacent layer 11 and the recording layer 12 in the +y direction to generate the torque in the +x direction as the Slonczewski-like torque $\tau_{st}$. In this case, the second external magnetic field Bx is applied in the +x direction by the x-direction magnetic field application structure 3. Here, the second external magnetic field Bx has a positive value. As a result, under an external magnetic field Bext=(Bx, By, 0), the direction of magnetization of the recording layer 12 is changed in accordance with the above-mentioned equation (1), and the switching of magnetization of the recording layer 12 to the −z direction is facilitated. As a result, the write window can be enlarged.

In contrast, when data "0" is to be written into the magnetic memory element 1 (that is, when the magnetization of the recording layer 12 is to be switched to the +z direction), the write current Iw is allowed to flow through the adjacent layer 11 and the recording layer 12 in the −y direction to generate the torque in the −x direction as the Slonczewski-like torque $\tau_{sl}$. In this case, the second external magnetic field |Bx| is applied in the −x direction by the x-direction magnetic field application structure 3. Here, the second external magnetic field Bx has a negative value. As a result, under the external magnetic field Bext=(Bx, By, 0), the direction of magnetization of the recording layer 12 is changed in accordance with the above-mentioned equation (1), and the switching of magnetization of the recording layer 12 to the +z direction is facilitated. As a result, the write window can be enlarged.

The direction (+y direction or −y direction) in which the write current Iw is allowed to flow is determined depending on the following three factors:

(a) the sign of the spin Hall angle of the material of the adjacent layer 11;

(b) the direction (+y direction or −y direction) of the first external magnetic field By, which is applied in the y-axis direction; and (c) positional relationship of the adjacent layer 11 and the recording layer 12.

For example, when a film (for example, Ta film) made of a material having a spin Hall angle of a negative sign is used as the adjacent layer 11, the direction of the write current Iw is set opposite to the direction illustrated in each of FIG. 5A and FIG. 5B. In other words, when data "1" is to be written into the magnetic memory element 1, the write current Iw is allowed to flow in the −y direction, and when data "0" is to be written into the magnetic memory element 1, the write current Iw is allowed to flow in the +y direction.

Moreover, when the direction of the first external magnetic field By, which is applied in the y-axis direction, is opposite to the direction illustrated in FIG. 5A and FIG. 5B (that is, when a first external magnetic field |By| is applied in the −y direction (By<0)), the direction of the write current Iw is set opposite to the direction illustrated in each of FIG. 5A and FIG. 5B.

Further, for the structure in which positions of the adjacent layer 11 and the recording layer 12 are opposite to the positions of the adjacent layer 11 and the recording layer 12 illustrated in FIG. 5A and FIG. 5B (that is, the structure in which the adjacent layer 11 is joined to an upper surface of the recording layer 12), the direction in which the write current Iw is allowed to flow is also set opposite to the direction illustrated in each of FIG. 5A and FIG. 5B.

When the direction of the write current Iw is switched due to the above-mentioned factors (a) to (c), the direction (first magnetic field application direction) of the second external magnetic field Bx, which is applied in the x-axis direction, is switched in accordance with the direction of the Slonczewski-like torque $\tau_{sl}$. For example, when the film (for example, Ta film) made of the material having the spin Hall angle of the negative sign is used as the adjacent layer 11, in writing data "1" into the magnetic memory element 1, the write current Iw is allowed to flow in the −y direction, and the second external magnetic field Bx is applied in the +x direction (Bx>0). In contrast, in writing data "0" into the magnetic memory element 1, the write current Iw is allowed to flow in the +y direction, and a second external magnetic field |Bx| is applied in the −x direction (Bx<0).

Moreover, when the direction of the first external magnetic field By, which is applied in the y-axis direction, is opposite to the direction illustrated in FIG. 5A and FIG. 5B, the direction of the write current Iw is set opposite to the direction illustrated in each of FIG. 5A and FIG. 5B, and the direction (first magnetic field application direction) of the second external magnetic field Bx, which is applied in the x-axis direction, is also set opposite in the same manner.

Further, when the structure in which positions of the adjacent layer 11 and the recording layer 12 are opposite to the positions of the adjacent layer 11 and the recording layer 12 illustrated in FIG. 5A and FIG. 5B (that is, the structure in which the adjacent layer 11 is joined to an upper surface of the recording layer 12), the direction of the write current Iw is set opposite to the direction illustrated in each of FIG. 5A and FIG. 5B, and the direction (first magnetic field application direction) of the second external magnetic field Bx, which is applied in the x-axis direction, is the same as the direction illustrated in each of FIG. 5A and FIG. 5B.

(Verification of Effect of Enlargement of Write Window)

The inventors of this invention confirmed by simulation the effect of the enlargement of the write window by the application of the second external magnetic field Bx in the x-axis direction.

Figure 6A:
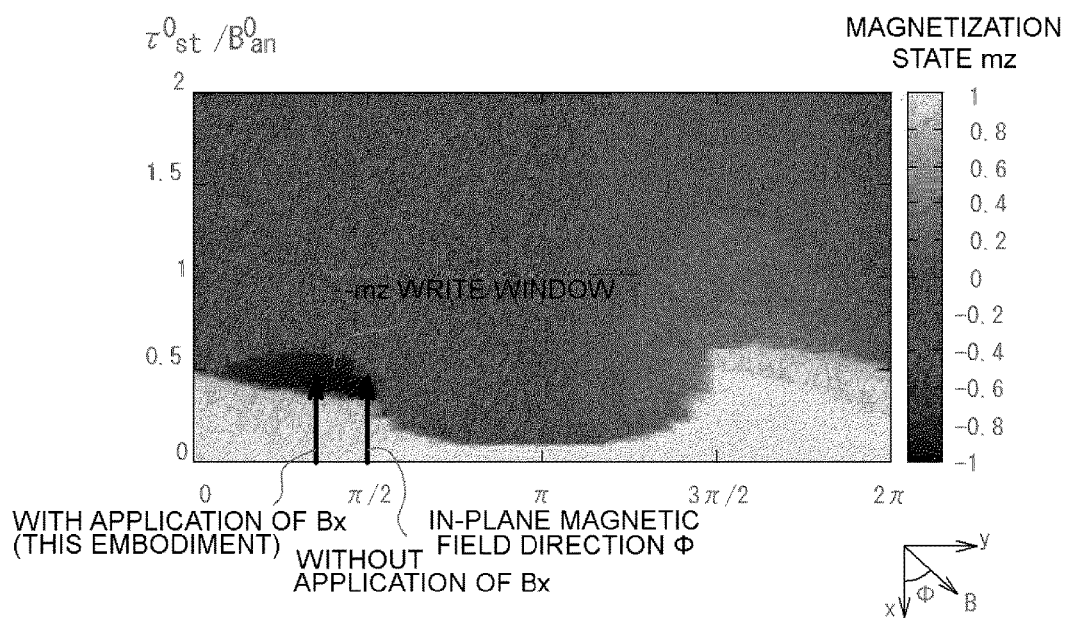
FIG. 6A is a graph for showing a write window of the operation of writing data "1" into the magnetic memory according to the first example embodiment.
Figure 6B:
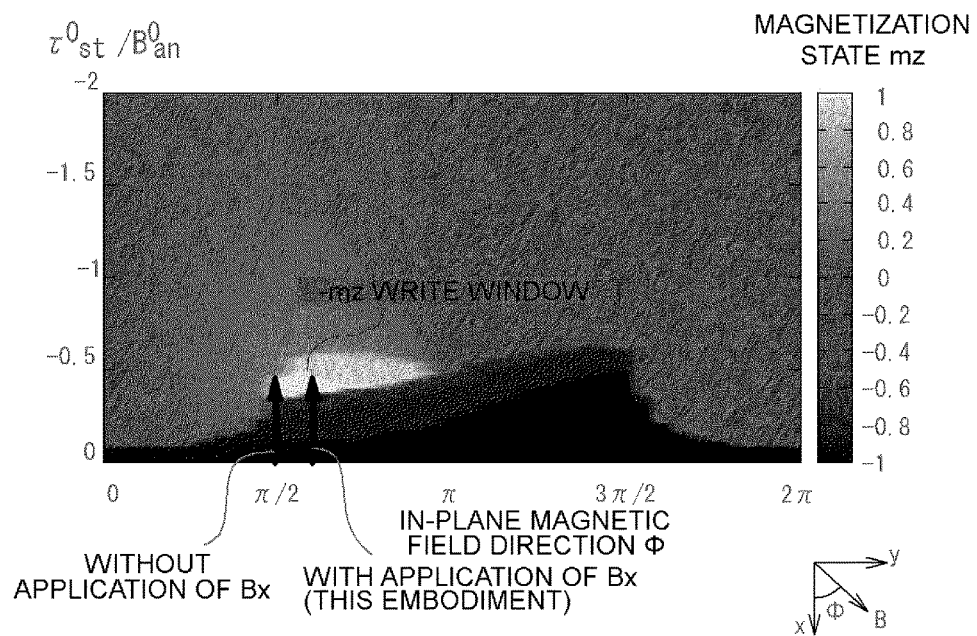
FIG. 6B is a graph for showing a write window of the operation of writing data "0" into the magnetic memory according to the first example embodiment.

Each of FIG. 6A and FIG. 6B is a graph for showing an example of the write window of the magnetic memory element 1 according to the first example embodiment, which was obtained by the simulation. The simulation in FIG. 6A and FIG. 6B was performed with a value of an external magnetic field $|Bext|/B^0_{an}$, which was standardized by an anisotropic magnetic field $B^0_{an}$, being set to 0.2, and with a value of a damping constant α being set to 0.01. The horizontal axis in each of FIG. 6A and FIG. 6B indicates an in-plane magnetic field azimuth Φ, which is defined by the following equation (6a):

$$\tan \Phi = By/Bx, \quad (6a)$$

that is, the following equation (6b):

$$\Phi = \arctan(By/Bx) \quad (6b).$$

The second and first external magnetic fields Bx and By are defined as being positive in the +x direction and the +y direction, respectively, which are illustrated in FIG. 2A to FIG. 2C. The vertical axis in each of FIG. 6A and FIG. 6B indicates Slonczewski-like torque standardized by a magnitude of the anisotropic magnetic field, and corresponds to the magnitude of the write current Iw.

In FIG. 6A, there is shown dependency of a component in the z-axis direction of the magnetization of the recording layer 12 after writing from data "0" to data "1" on the in-plane magnetic field azimuth Φ and the Slonczewski-like torque, that is, a write window in which data "1" can be written normally. Shades at respective positions of FIG. 6A each indicate a value obtained by standardizing a component mz in a z direction of the magnetization of the recording layer 12 after the writing to a value of −1 or more and 1 and less, and such region that the component mz has a value of "−1" or close to "−1" indicates the write window in the operation of writing data "1".

As can be understood from FIG. 6A, it can be seen that the write window for data "1" is distributed in a range of in-plane magnetic field azimuths Φ of from 0 to π/2. It should be noted that, when the in-plane magnetic field azimuth Φ is in the range of from 0 to π/2, the second external magnetic field Bx (Bx>0) is applied in the +x direction. When Slonczewski-like torque that is larger than a top end of the write window for data "1" is applied (that is, when an excessive write current Iw is supplied), the magnetic memory element enters the intermediate state, and causes a fear of miswriting. Moreover, when the in-plane magnetic field azimuth Φ becomes an angle corresponding to a right end of the write window for data "1", that is, an angle larger than π/2, the magnetic memory element enters the intermediate state, and causes a fear of miswriting.

When the second external magnetic field Bx is not applied in the x-axis direction, that is, when Bx=0, data is written at the in-plane magnetic field azimuth Φ of Φ=π/2 or in the vicinity thereof, and in this case, an operating point of the write operation is located at the right end of the write window for data "1". Therefore, when the second external magnetic field Bx is not applied in the x-axis direction, there is a fear that a write condition of the magnetic memory element 1 may deviate from the write window due to misalignment of an external magnetic field By and a variation in magnetic anisotropy of the recording layer 12.

Meanwhile, in the magnetic memory 10 according to the first example embodiment, which includes the x-direction magnetic field application structure 3, the second external magnetic field Bx may be applied in the x-axis direction (in the example of FIG. 6A, +x direction), the in-plane magnetic field azimuth Φ may be adjusted to a desired value between 0 and π/2. Therefore, it is expected that data is written stably even when misalignment of the first external magnetic field By and a variation in magnetic anisotropy of the recording layer 12 occur.

In FIG. 6B, there is shown dependency of a component in the z-axis direction of the magnetization of the recording layer 12 after writing from data "1" to data "0" on the in-plane magnetic field azimuth Φ and the Slonczewski-like torque, that is, a write window in which data "0" can be written normally. Similarly to FIG. 6A, shades at respective positions of FIG. 6B each indicate a value obtained by standardizing a component mz in a z direction of the magnetization of the recording layer 12 after the writing to a value of +1 or more and 1 and less, and such region that the component mz has a value of "+1" or close to "+1" indicates the write window in the operation of writing data "0".

As can be understood from FIG. 6B, it can be seen that the write window for data "0" is distributed in a range of in-plane magnetic field azimuths Q of from π/2 to π. It should be noted that, when the in-plane magnetic field azimuth Φ is in the range of from π/2 to π, the second external magnetic field |Bx| (Bx<0) is applied in the −x direction. When Slonczewski-like torque that is larger than a top end of the write window for data "0" is applied (that is, when the excessive write current Iw is supplied), the magnetic memory element enters the intermediate state, and causes a fear of miswriting. Moreover, when the in-plane magnetic field azimuth Φ becomes an angle corresponding to a left end of the write window for data "0", that is, an angle smaller than π/2, the magnetic memory element enters the intermediate state, and causes a fear of miswriting.

When the second external magnetic field Bx is not applied in the x-axis direction, that is, when Bx=0, data is written at the in-plane magnetic field azimuth Φ of Φ=π/2 or in the vicinity thereof, and in this case, an operating point of the write operation is located at the left end of the write window for data "0". Therefore, when the magnetic field is not applied in the x-axis direction, there is a fear that a write condition of the magnetic memory element 1 may deviate from the write window due to misalignment of the first external magnetic field By and a variation in magnetic anisotropy of the recording layer 12.

Meanwhile, in the magnetic memory 10 according to the first example embodiment, which includes the x-direction magnetic field application structure 3, the second external magnetic field Bx may be applied in the x-axis direction (in the example of FIG. 6B, −x direction), the in-plane magnetic field azimuth Φ may be adjusted to a desired value between π/2 and π. Therefore, it is expected that data is written stably even when misalignment of the first external magnetic field By and a variation in magnetic anisotropy of the recording layer occur.

As described above, when the direction of the first external magnetic field By, which is applied in the y-axis direction, is switched, the direction in which the write current Iw is allowed to flow is switched in each case. With this switching, the direction of the second external magnetic field Bx, which is applied in the x-axis direction, is also switched. In this case, the write window for data "0" is distributed in a range of the in-plane magnetic field azimuth Φ of from π to 3π/2, and the write window for data "1" is distributed in a range of the in-plane magnetic field azimuth Φ of from 3π/2 to 2π. The direction (first magnetic field application direction) of the second external magnetic field Bx is set to be in a range of the in-plane magnetic field azimuth Φ of from π to 3π/2 when data "0" is to be written, and in a range of the in-plane magnetic field azimuth Φ of from π to 3π/2 when data "1" is to be written.

It should be noted that, as described above, data "0" and data "1" are merely associated with one and another of two states of the magnetic memory element 1. When definitions of data "0" and data "1" are interchanged (that is, a state in which the magnetization of the recording layer 12 is directed to the −z direction is defined as data "0", and a state in which the magnetization of the recording layer 12 is directed to the +z direction is defined as data "1"), definition of the write window for data "0" and definition of the write window for data "1" are also interchangeable.

As described above, with the magnetic memory in the first example embodiment, data can be written stably when in-plane current-induced perpendicular switching of magnetization is used to write data.

(Second Example Embodiment)

In accordance with the above-mentioned equation (2), the total torque $\tau_{tot}$ that acts on the magnetization is expressed as a sum of the Slonczewski-like torque $\tau_{st}$, which includes contributions from the Rashba field and the spin Hall effect, which are induced by the electric current, the torque $\tau_{ext}$ caused by an external magnetic field, and the torque $\tau_{an}$ caused by the magnetic anisotropy.

However, according to studies of the inventors of this invention, the write current Iw flowing through the adjacent layer 11 generates the Oersted field (current-induced magnetic field), and the write current Iw flowing through the adjacent layer 11 and the recording layer 12 generates field-like torque, which includes contributions from the Rashba field and the spin Hall effect. Therefore, in order to express a movement of magnetization more accurately, the Oersted field and the field-like torque need to be taken into consideration. When the Oersted field and the field-like torque are taken into consideration, the above-mentioned equation (2), which expresses the total torque $\tau_{tot}$, is changed to the following equation (7):

$$\tau_{tot}=\tau_{st}+\tau_{ext}+\tau_{an}+\tau_{F}+\tau_{Oe} \qquad (7)$$

In the equation (7), $\tau_F$ represents field-like torque, which is generated when the write current Iw flows through the adjacent layer 11 and the recording layer 12, and roe represents torque caused by the Oersted field by the write current Iw flowing through the adjacent layer 11, which are given by the following equations (8) and (9).

$$\tau_F = -m \times B_F = -B_F^0(m \times x) \quad (8)$$

$$\tau_{Oe} = -m \times B_{Oe} = -B_{Oe}^0(m \times x) \quad (9)$$

In the equations (8) and (9), $B^0_F$ represents a magnification including the sign of the field-like torque, and $B^0_{Oe}$ represents a magnification including the sign of the Oersted field. It should be noted that directions of the field-like torque and the Oersted field both depend on the direction of the write current.

From the above-mentioned equations (8) and (9), it is understood that $B^0_F$ and $B^0_{Oe}$ are equivalent to the second external magnetic field Bx externally applied in the x-axis direction (that is, the second external magnetic field Bx applied by the x-direction magnetic field application structure 3). $B^0_F$ is hereinafter referred to as an effective magnetic field caused by the field-like torque. When an actual magnetic field Bx' in the x-axis direction is defined using the effective magnetic field $B^0_F$ caused by the field-like torque and an Oersted field $B^0_{Oe}$ as the following equation (10):

$$Bx' = Bx + B^0_F + B^0_{Oe} \quad (10),$$

and when the actual magnetic field Bx' is used in place of the second external magnetic field Bx, a more accurate discussion than the discussion provided in the first example embodiment is established. Specifically, the magnitude and the direction of the second external magnetic field Bx, which is applied by the x-direction magnetic field application structure 3, are determined so that a direction of the actual magnetic field Bx' is a desired direction that depends on the direction, that is, the +x direction or the −x direction, of the write current Iw to enlarge the write window in writing data. It should be noted here that the direction of the second external magnetic field Bx, which is applied by the x-direction magnetic field application structure 3, does not always coincide with the direction of the actual magnetic field Bx'. The direction of the actual magnetic field Bx' is also called "third magnetic field application direction".

More specifically, when the adjacent layer 11 is joined to the lower surface of the recording layer 12, a thin film (for example, Pt film) made of the material having the positive spin Hall angle is used as the adjacent layer 11, and the first external magnetic field By is applied to the recording layer 12 in the +y direction by the y-direction magnetic field application structure 2, the write operation is performed as follows.

When data "1" is to be written into the magnetic memory element 1 (that is, when the magnetization of the recording layer 12 is to be switched to the −z direction), the write current Iw is allowed to flow in the +y direction, and torque in the +x direction is generated as the Slonczewski-like torque $\tau_{st}$. In this case, the second external magnetic field Bx is applied by the x-direction magnetic field application structure 3 so that the direction (third magnetic field application direction) of the actual magnetic field Bx' (Bx'>0) is the +x direction. In contrast, when data "0" is to be written into the magnetic memory element 1 (that is, when the magnetization of the recording layer 12 is to be switched to the +z direction), the write current Iw is allowed to flow in the −y direction, and torque in the −x direction is generated as the Slonczewski-like torque $\tau_{st}$. In this case, the second external magnetic field Bx is applied by the x-direction magnetic field application structure 3 so that the direction (third magnetic field application direction) of the actual magnetic field Bx' is the −x direction. As a result, the write window can be enlarged.

Moreover, also with regard to the discussion on the in-plane magnetic field azimuth $\Phi$ in the first example embodiment, an actual in-plane magnetic field azimuth $\Phi'$ defined by the following equation (11a):

$$\tan \Phi' = By/Bx' \quad (11a),$$

that is, the following equation (11b):

$$\Phi' = \arctan(By/Bx') \quad (11b)$$

is applied in place of the in-plane magnetic field azimuth $\Phi$ to apply a similar discussion as that in the first example embodiment.

Here, it should be noted that, as described in Non Patent Document 5, for example, the sum of the effective magnetic field $B^0_F$ caused by the field-like torque and the Oersted field $B^0_{Oe}$, can be adjusted by materials and thicknesses of the adjacent layer 11 and the recording layer 12. This means that, when the sum of the effective magnetic field $B^0_F$ caused by the field-like torque and the Oersted field $B^0_{Oe}$ is controlled by the materials and the thicknesses of the adjacent layer 11 and the recording layer 12, a desired actual magnetic field Bx' may be achieved without applying the second external magnetic field Bx by the x-direction magnetic field application structure 3.

Figure 7:
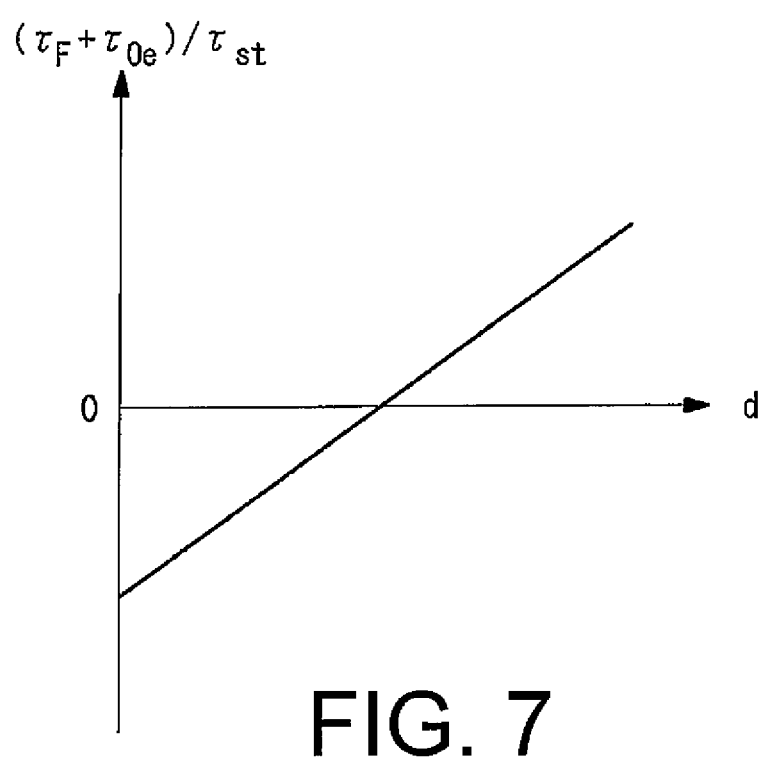
FIG. 7 is a graph for conceptually showing field-like torque $\tau_F$ and torque $\tau_{Oe}$ caused by an Oersted field.

For example, FIG. 7 is a graph for conceptually showing, in the structure in which a Co film and a Pt film are laminated, which is disclosed in Non Patent Document 5, an example of dependency of a sum of the field-like torque $\tau_F$ and torque $\tau_{Oe}$ caused by the Oersted field on the Co film. In Non Patent Document 5, it is disclosed that the sum of the field-like torque $\tau_F$ and the torque $\tau_{Oe}$ caused by the Oersted field is increased along with increase in thickness $d_{Co}$ of the Co film. As can be understood from the above-mentioned equations (8) and (9), this is equivalent to an increase in sum of the effective magnetic field $B^0_F$ caused by the field-like torque and the Oersted field $B^0_{Oe}$ along with increase in thickness $d_{Co}$ of the Co film. A direction of the sum of the effective magnetic field $B^0_F$ and the Oersted field $B^0_{Oe}$ is also called "second magnetic field application direction".

Figure 8A:
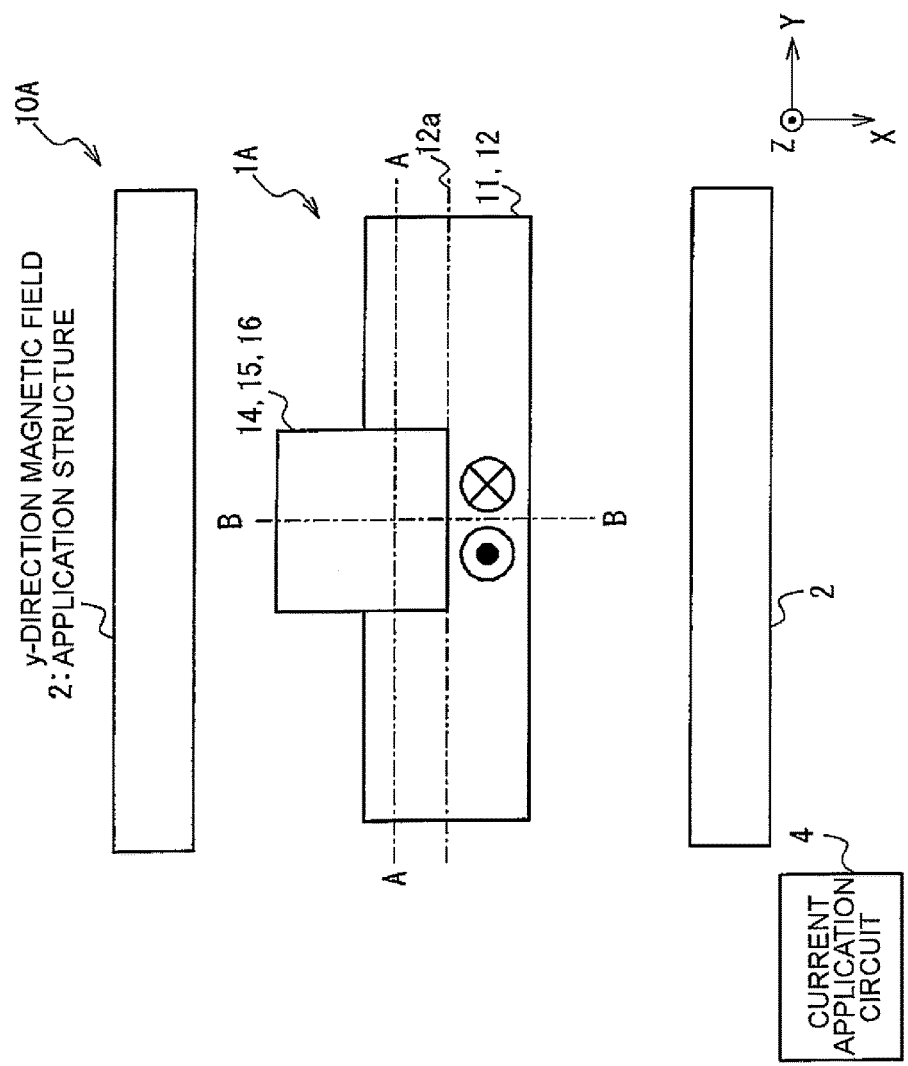
FIG. 8A is a plan view for illustrating the structure of a magnetic memory according to a second example embodiment of this invention.
Figure 8B:
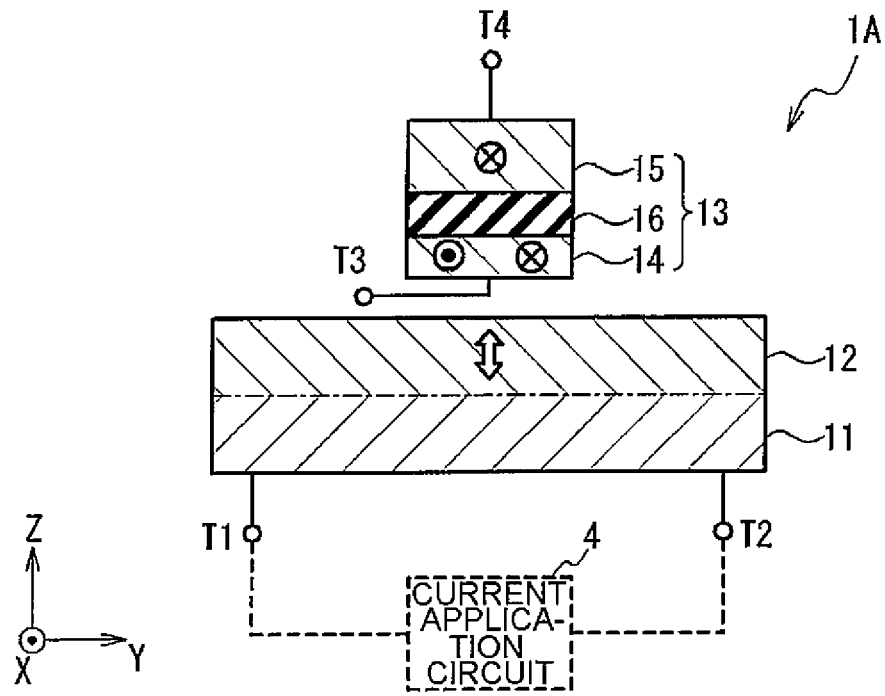
FIG. 8B is a cross-sectional view for illustrating a cross-sectional structure of a magnetic memory element according to the second example embodiment, which is taken along the cross section A-A of FIG. 8A.
Figure 8C:
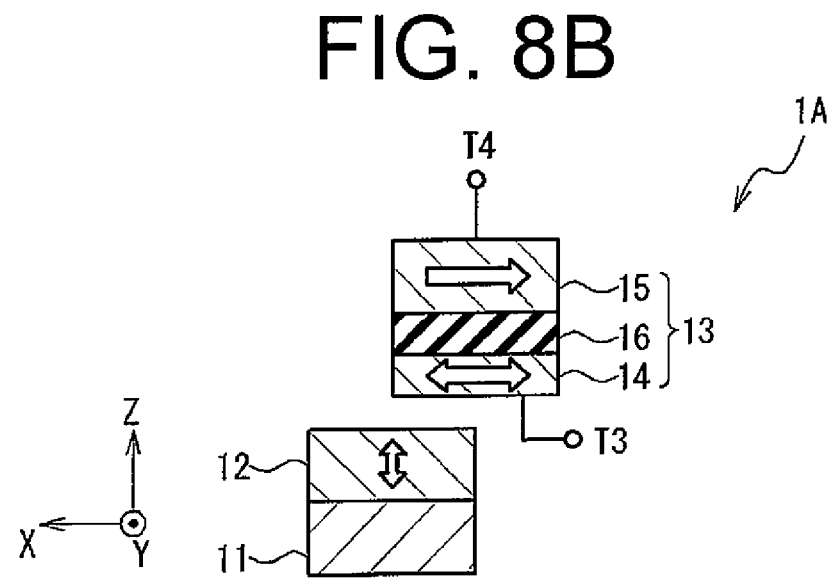
FIG. 8C is a cross-sectional view for illustrating a cross-sectional structure of the magnetic memory element according to the second example embodiment, which is taken along the cross section B-B of FIG. 8A.

FIG. 8A to FIG. 8C are views for illustrating an example of the structure of a magnetic memory 10A, which achieves the desired actual magnetic field Bx' without using the x-direction magnetic field application structure 3, which is configured to apply the second external magnetic field Bx in the x-axis direction. In the magnetic memory 10A illustrated in FIG. 8A and FIG. 8C, the x-direction magnetic field application structure 3 is not provided. Instead, the sum of the effective magnetic field $B^0_F$ caused by the field-like torque and the Oersted field $B^0_{Oe}$ is adjusted by materials and thicknesses of the adjacent layer 11 and the recording layer 12 of a magnetic memory element 1A, and the desired actual magnetic field Bx' is achieved in effect. Also with such structure, the write window can be enlarged to stably write data. In addition, the structure of FIG. 8A to FIG. 8C, which does not include the x-direction magnetic field application structure 3, is effective in reducing an area of the magnetic memory 10A.

The example embodiments of this invention have been specifically described above, but this invention is not limited to the above-mentioned example embodiments. It should be apparent to those skilled in the art that this invention may be embodied with various modifications.

This application is based upon and claims the benefit of priority from Japanese Patent Application No. 2014-214729, filed on Oct. 21, 2014, the disclosure of which is incorporated herein in its entirety by reference.

REFERENCE SIGNS LIST 10, 10A magnetic memory
1, 1A magnetic memory element
2 y-direction magnetic field application structure
3 x-direction magnetic field application structure
4 current application circuit
11 adjacent layer
12 recording layer
12a center line
13 MTJ
14 sense layer
15 reference layer
16 tunnel barrier layer
101 adjacent layer
102 perpendicular magnetic film

What is claimed is:

1. A magnetic memory, comprising:
a recording layer formed as a perpendicular magnetic film;
an adjacent layer joined to an upper surface or a lower surface of the recording layer;
an external magnetic field application part configured to apply a first external magnetic field to the recording layer in a first direction which is an in-plane direction of the recording layer; and
a current application circuit configured to allow a write current to flow through the adjacent layer and the recording layer in the first direction or a second direction which is opposite to the first direction,
wherein the recording layer, the adjacent layer, and the external magnetic field application part are configured to switch any one of a first magnetic field application direction, a second magnetic field application direction, and a third magnetic field application direction in accordance with a direction of the write current, the first magnetic field application direction being a direction of a second external magnetic field applied in a third direction which is another in-plane direction of the recording layer and which is perpendicular to the first direction, the second magnetic field application direction being a direction of a sum of an effective magnetic field caused by field-like torque generated when the write current flows through the adjacent layer and the recording layer and an Oersted field generated when the write current flows through the adjacent layer, the third magnetic field application direction being a direction of an actual magnetic field which is a sum of the second external magnetic field, the effective magnetic field, and the Oersted field, and
wherein the second magnetic field application direction is adjusted to be substantially equal to the third direction by adjusting materials and thicknesses of the adjacent layer and the recording layer.

2. A magnetic memory according to claim 1, wherein the external magnetic field application part comprises:
a first external magnetic field application structure configured to generate the first external magnetic field; and
a second external magnetic field application structure configured to generate the second external magnetic field, and
wherein the first magnetic field application direction is switched in accordance with the direction of the write current.

3. A magnetic memory according to claim 2, wherein the second external magnetic field is applied in the same direction as a direction of Slonczewski-like torque which is generated when the write current flows through the adjacent layer and the recording layer.

4. A magnetic memory according to claim 2, wherein, when an in-plane magnetic field angle $\Phi$ is defined as $\arctan(By/Bx)$, where By represents the first external magnetic field which is positive when directed to the first direction, and Bx represents the second external magnetic field,
wherein the second external magnetic field application structure is configured to apply, when the first external magnetic field By is positive, the second external magnetic field so that the in-plane magnetic field angle $\Phi$ is more than 0 and less than $\pi/2$ when one of data "0" and data "1" is written into the recording layer, and so that the in-plane magnetic field angle $\Phi$ is more than $\pi/2$ and less than $\pi$ when another of data "0" and data "1" is written into the recording layer, and
wherein the second external magnetic field application structure is configured to apply, when the first external magnetic field By is negative, the second external magnetic field so that the in-plane magnetic field angle $\Phi$ is more than $\pi$ and less than $3\pi/2$ when one of data "0" and data "1" is written into the recording layer, and the second external magnetic field so that the in-plane magnetic field angle $\Phi$ is more than $3\pi/2$ and less than $2\pi$ when another of data "0" and data "1" is written into the recording layer.

5. A magnetic memory according to claim 1,
wherein the external magnetic field application part comprises:
a first external magnetic field application structure configured to generate the first external magnetic field; and
a second external magnetic field application structure configured to generate the second external magnetic field, and
wherein the second external magnetic field application structure is configured to generate the second external magnetic field so that the third magnetic field application direction is switched in accordance with the direction of the write current.

6. A magnetic memory according to claim 5, wherein, when an actual in-plane magnetic field angle $\Phi'$ is defined as $\arctan(By/Bx')$, where By represents the first external magnetic field, which is positive when directed to the first direction, and Bx' represents the actual magnetic field,
wherein the second external magnetic field application structure is configured to apply, when the first external magnetic field By is positive, the second external magnetic field so that the actual in-plane magnetic field angle $\Phi'$ is more than 0 and less than $\pi/2$ when one of data "0" and data "1" is written into the recording layer, and so that the actual in-plane magnetic field angle $\Phi'$ is more than $\pi/2$ and less than $\pi$ when another of data "0" and data "1" is written into the recording layer, and
wherein the second external magnetic field application structure is configured to apply, when the first external magnetic field By is negative, the second external magnetic field so that the actual in-plane magnetic field angle $\Phi'$ is more than $\pi$ and less than $3\pi/2$ when one of data "0" and data "1" is written into the recording layer, and the second external magnetic field so that the actual in-plane magnetic field angle $\Phi'$ is more than $3\pi/2$ and less than $2\pi$ when another of data "0" and data "1" is written into the recording layer.

7. A magnetic memory according to claim 1,
wherein the recording layer, the adjacent layer, and the external magnetic field application part are configured to switch the second magnetic field application direction in accordance with the direction of the write current, and
wherein an external magnetic field in the direction perpendicular to the first direction is inhibited from being applied to the recording layer.

8. A magnetic memory according to claim 1, wherein the recording layer includes a film made of a ferromagnetic material or ferrimagnetic material containing at least one of Fe, Co, and Ni.

9. A magnetic memory according to claim 1, wherein the adjacent layer includes a metal film formed of Pt, Pd, Au, Ag, Cu, Ta, W, Nb, Mb, or an alloy containing two or more thereof.

10. A magnetic memory according to claim 1,
wherein the second magnetic field application direction is adjusted to be equal to the third direction by adjusting materials and thicknesses of the adjacent layer and the recording layer.

11. A method of writing data into a magnetic memory element, the magnetic memory element including a recording layer formed as a perpendicular magnetic film and an adjacent layer joined to an upper surface or a lower surface of the recording layer, the method comprising:
applying a first external magnetic field to the recording layer in a first direction which is an in-plane direction of the recording layer;
allowing a write current to flow through the adjacent layer and the recording layer in the first direction or a second direction which is opposite to the first direction; and
applying a second external magnetic field in a direction perpendicular to the first direction,
wherein the direction of the second external magnetic field or a direction of an actual magnetic field is switched in accordance with a direction of the write current, the actual magnetic field being a sum of an effective magnetic field caused by field-like torque generated when the write current flows through the adjacent layer and the recording layer, an Oersted field generated when the write current flows through the adjacent layer, and the second external magnetic field.

12. A method of writing data into a magnetic memory element, the magnetic memory element including a recording layer formed as a perpendicular magnetic film and an adjacent layer joined to an upper surface or a lower surface of the recording layer, the method comprising:
applying a first external magnetic field to the recording layer in a first direction which is an in-plane direction of the recording layer; and
allowing a write current to flow through the adjacent layer and the recording layer in the first direction or a second direction which is opposite to the first direction,
wherein a direction of a sum of an effective magnetic field caused by field-like torque generated when the write current flows through the adjacent layer and the recording layer and an Oersted field generated by the write current is switched in accordance with a direction of the write current, and
wherein the direction of the sum of the effective magnetic field and the Oersted field is adjusted to be substantially equal to a third direction which is another in-plane direction of the recording layer and which is perpendicular to the first direction by adjusting materials and thicknesses of the adjacent layer and the recording layer.

13. A method according to claim 12,
wherein the direction of the sum of the effective magnetic field and the Oersted field is adjusted to be equal to the third direction.

* * * * *